United States Patent [19]
Brodsky et al.

[11] Patent Number: 5,703,331
[45] Date of Patent: *Dec. 30, 1997

[54] CIRCUITIZED STRUCTURE INCLUDING FLEXIBLE CIRCUIT WITH ELASTOMERIC MEMBER BONDED THERETO

[75] Inventors: William Louis Brodsky, Binghamton; James Daniel Herard, Vestal; Thomas George Macek, Endicott; Timothy Lee Sharp, Berkshire; George Joseph Shovlowsky, Owego, all of N.Y.

[73] Assignee: International Business Machines Corporation, Armonk, N.Y.

[ * ] Notice: The term of this patent shall not extend beyond the expiration date of Pat. No. 5,468,917.

[21] Appl. No.: 500,716

[22] Filed: Jul. 11, 1995

Related U.S. Application Data

[63] Continuation of Ser. No. 217,141, Mar. 23, 1994, Pat. No. 5,468,917.

[51] Int. Cl.⁶ .................................................. H05K 1/14
[52] U.S. Cl. .................... 174/254; 174/255; 174/261; 439/78; 361/790
[58] Field of Search .......................... 174/250, 255, 174/254, 261; 439/67, 76, 83, 78, 77, 55; 361/748, 749, 790

[56] References Cited

U.S. PATENT DOCUMENTS

| | | | |
|---|---|---|---|
| 4,116,517 | 9/1978 | Selvin et al. | 339/17 F |
| 4,403,272 | 9/1983 | Larson et al. | 361/398 |
| 4,548,451 | 10/1985 | Benarr et al. | 339/17 M |
| 4,902,234 | 2/1990 | Brodsky et al. | 439/67 |
| 5,046,953 | 9/1991 | Shreeve et al. | 439/66 |
| 5,059,129 | 10/1991 | Brodsky et al. | 439/67 |
| 5,099,393 | 3/1992 | Bentlage et al. | 361/413 |
| 5,147,208 | 9/1992 | Bachler | 439/67 |
| 5,187,020 | 2/1993 | Kwon et al. | 428/601 |
| 5,261,158 | 11/1993 | Schreiber et al. | 29/848 |
| 5,354,205 | 10/1994 | Fergenbaum et al. | 439/67 |
| 5,427,535 | 6/1995 | Sinclair | 439/66 |
| 5,468,917 | 11/1995 | Brodsky et al. | 174/255 |

FOREIGN PATENT DOCUMENTS

| | | | |
|---|---|---|---|
| 0366885 | 5/1990 | European Pat. Off. | H01R 9/07 |
| 0520681 | 12/1992 | European Pat. Off. | H05K 1/00 |
| 2041828 | 9/1980 | United Kingdom | B32B 3/10 |
| 2058652 | 4/1981 | United Kingdom | B29D 31/00 |

OTHER PUBLICATIONS

39th Electronic Components Conference, May 1989, "Use of Anisotropically Conductive Elastomers in High Density Separable Connectors", W. R. Lambert et al., pp. 99–106.

*Primary Examiner*—Hyung S. Sough
*Assistant Examiner*—Paramita Ghosh
*Attorney, Agent, or Firm*—Lawrence R. Fraley

[57] ABSTRACT

A circuitized structure including a flexible circuit with at least one layer of dielectric having a plurality of electrically conductive members (e.g., copper pads) thereon. An elastomeric member including a plurality of upstanding portions each having a respective metallic pad member thereon is utilized, this elastomeric-pad structure being bonded to the flexible circuit at locations relative to respective ones of the conductive members so as to assure substantially independent force exertion thereon, e.g., when the flexible circuit is electrically coupled to a separate, circuitized substrate such as a printed circuit board. A method for making an elastomeric support member for use in such a circuitized substrate is also provided.

12 Claims, 3 Drawing Sheets

CIRCUITIZED STRUCTURE INCLUDING FLEXIBLE CIRCUIT WITH ELASTOMERIC MEMBER BONDED THERETO

This is a continuation of application Ser. No. 08/217,141 filed on Mar. 23, 1994 now U.S. Pat. No. 5,468,917.

TECHNICAL FIELD

The invention relates to circuitized substrates and particularly to those of the flexible variety. Even more particularly, the invention relates to circuitized substrates wherein elastomeric elements or the like are used in conjunction therewith.

BACKGROUND OF THE INVENTION

The use of elastomerics in combination with various circuitized substrate structures, e.g., as part of electrical connectors, is known. Examples are defined in U.S. Pat. No. 4,902,234 (Bredsky et al.) and U.S. Pat. No. 5,059,129 (Brodsky et al.), both of which are assigned to the same assignee as the present invention. These patents are incorporated herein by reference.

The use of elastomers is highly desirable for several reasons, e.g., reliable contact pressure of substantial duration, resistance to adverse environmental conditions such as heat and/or moisture, compactness of design, etc. Heretofore, such elastomers typically comprised separate structures which were then aligned with an associated circuit member, e.g., a printed circuit board (as mentioned in U.S. Pat. No. 5,059,129) to thereby exert pressure against the member as desired.

One particular concern with the foregoing structures has been with respect to assuring effective alignment between elastomer and substrate. Typically, such alignment has necessitated use of alignment pins, associated housing (or holder) elements, etc., thereby adding to the overall cost (and complexity) of the finished structure. Such problems, as is understood, are of particular concern when utilizing flexible circuits which are typically of very thin dielectric and include circuitry on one or both sides thereof. Alignment of and proper application of pressure against such circuitry, e.g., the pads thereof to associated pads of another circuit member is critical, particularly considering the relative minute size thereof.

As defined herein, the present invention defines the use of an elastomeric member of a new and unique design in combination with a flexible circuit or the like to assure positive force exertion against the circuit, e.g., to enable the circuit to engage another circuit. The invention assures an effective means of more positively engaging the flexible circuit and elastomeric member to thereby produce a final, circuitized structure. Still further, the invention defines a process for making an elastomeric member which can then conveniently be utilized with such e flexible circuit.

It is believed that such a circuitized substrate and method for making such substrate, as well as a method for making an elastomeric member capable of being readily utilized with same, would constitute a significant advancement in the art.

DISCLOSURE OF THE INVENTION

It is a primary object of the invention to enhance the art of circuitized substrates such as flexible circuits.

It is another object of the invention to provide an elastomeric member capable of being used in combination with a flexible circuit to provide enhanced exertion of desired forces against the circuit whereby the circuit can effectively engage another electrical structure, e.g., printed circuit board.

It is still another object of the invention to provide a circuitized substrate having such an elastomeric member as part thereof.

These and other objects of the invention are achieved in accordance with one aspect of the invention through the provision of a circuitized substrate including a flexible circuit including at least one layer of dielectric material having a plurality of electrically conductive members on a first surface thereof, an elastomeric member including a plurality of upstanding portions, a plurality of metallic pad members, selected ones of the pad members being secured to a respective one of the upstanding portions of the elastomeric members and means for bonding each of the selected ones of the pad members to the flexible circuit at locations relative to respective ones of the electrically conductive members.

In accordance with another aspect of the invention, there is provided a method of making an elastomeric support member, adapted for use with a flexible circuit. The method comprises the steps of providing a locating sheet including a layer of base material and a plurality of metallic pad members removably positioned thereon, positioning the locating sheet within a mold apparatus, providing a quantity of moldable elastomer material to the mold apparatus, molding the elastomer material to provide an elastomeric member having a plurality of upstanding elastomeric portions as part thereof, selected ones of the upstanding elastomeric portions being bonded to respective ones of the metallic pad members of said locating sheet, and removing the layer of base material from the metallic pad members having the elastomeric portions bonded thereto, the metallic pad members remaining bonded to the elastomeric portions following the removal.

In accordance with yet another aspect of the invention, there is provided a method of making an elastomeric support member wherein the method includes the steps of providing a mold apparatus, providing a quantity of moldable elastomer material to the mold apparatus, molding the elastomer material to provide an elastomeric member having a plurality of upstanding portions, removing the elastomeric member from the mold apparatus, and thereafter forming a metallic pad member on selected ones of the upstanding portions of the elastomeric member.

BEST MODE FOR CARRYING OUT THE INVENTION

For a better understanding of the present invention, together with other and further objects, advantages and capabilities thereof, reference is made to the disclosure and appended claims in connection with the above-described drawings.

Figure 1:
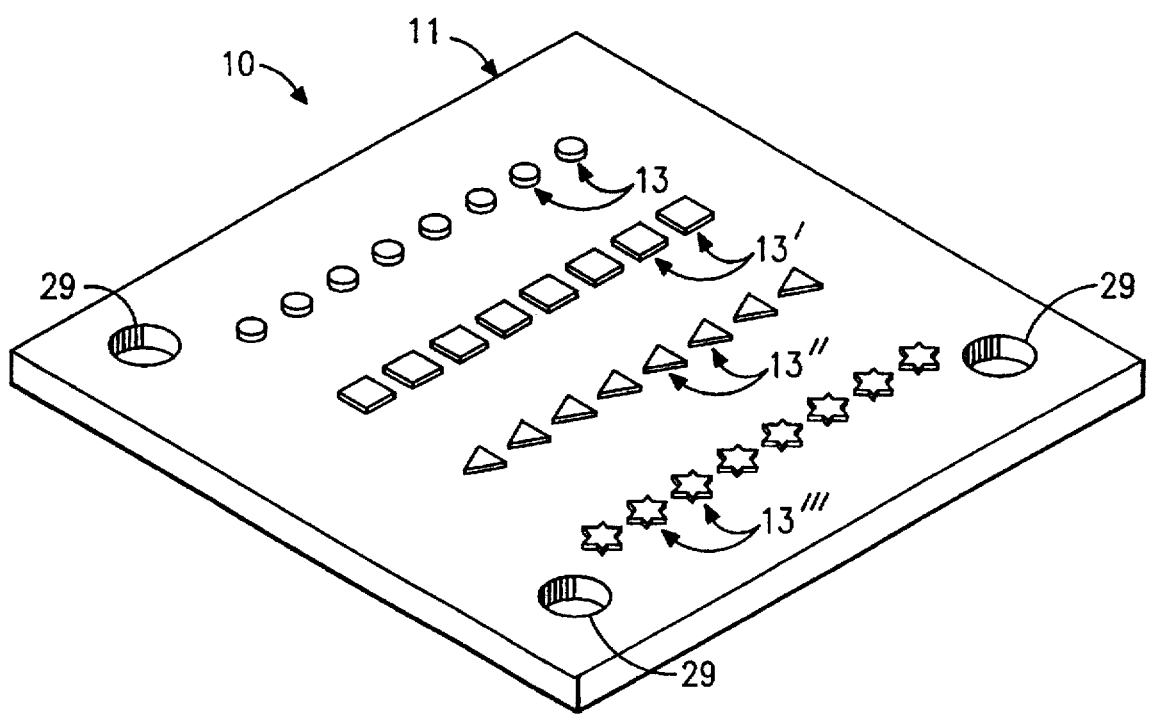
FIG. 1 is an isometric view of a locating sheet in accordance with one embodiment of the invention, this sheet shown as including a plurality of different shaped metallic pad members thereon.

In FIG. 1, there is shown a locating sheet 10 in accordance with one embodiment of the invention. Sheet 10, as described herein below, is adapted for use in the process for making a circuitized substrate (described below) in accordance with the teachings of the invention. Sheet 10 includes a layer 11 of base material, which, in one embodiment of the invention, may be comprised of either a polymer material (e.g., polyimide) or metallic material (e.g., copper). Layer 11 of this base material preferably has a thickness of only about 0.001 inch to about 0.005 inch.

Located on layer 11 are shown a plurality of metallic pad members 13, 13', 13" and 13'". Four different configurations for these metallic pad members are shown, and it is understood that this is for illustration purposes only in that several other configurations can also be successfully utilized. It is also within the scope of the invention to provide but a singular type of pad member and not a variety of shapes as shown. In one embodiment of the invention, a total of about 290 such pad members are placed on a layer 11 of base material of substantially rectangular shape (as shown) having length and width dimensions of about 1.00 inch and 0.20 inch respectively.

Each metallic pad member 13 (or 13', 13" or 13'") is preferably formed utilizing known photolithography techniques as typically used in the manufacture of printed circuits, e.g., for printed circuit boards or flexible circuit substrates. Such formation preferably occurs on the layer 11 of base material, with the nondesired metallic parts (not shown) subsequently removed in order to leave the desired pattern, e.g., as shown. Prior to such formation, however, a singular sheet of material, e.g., copper foil, is preferably attached to layer 11 using a suitable adhesive. More specifically, a sheet of copper foil, typically thinner than ½ oz., is attached to a sheet of pressure sensitive adhesive tape. The backing on such tapes may be comprised of Teflon, polyimide or polyetherimide. (Teflon is a trademark of E. I. duPont deNemours and Company.) Such tapes use a silicone-based adhesive which is about 0.0017 inch thick. The backing is typically 0.001 inch thick. Rollers are preferably used to smooth the tape against the copper lot. Such copper foils are common in the industry and may typically include one surface which has been pretreated for increased adhesion. The aforementioned photolithography process is then performed to complete removal of undesired metallic parts from this common sheet, thereby resulting in the desired pattern.

Significantly, the resulting individual pad members are adhesively secured to layer 11. The adhesive bond strength between the pad members and underlying layer 11 after curing of the elastomer is less than that between the pad members and formed elastomer (described below).

In one example, cyclindrical pads (e.g., 13 in FIG. 1) having a diameter of only about 0.013 inch and spaced apart a distance of only about 0.020 inch may be produced. Significantly, the resulting pattern of such pad members adheres to layer 11 in such a manner so as to allow subsequent removal of layer 11 therefrom, following formation of the invention's circuitized structure described below. Such separation, as defined heroin, occurs following the elastomeric formation in the manner defined herein. It is thus essential that the respective pad members adhere to layer 11 with only sufficient strength so as to allow separation thereof from layer 11 following effective bonding of these pad members to the elastomeric material in the manner defined below. The aforementioned silicone-based adhesives assure this.

Figure 2:
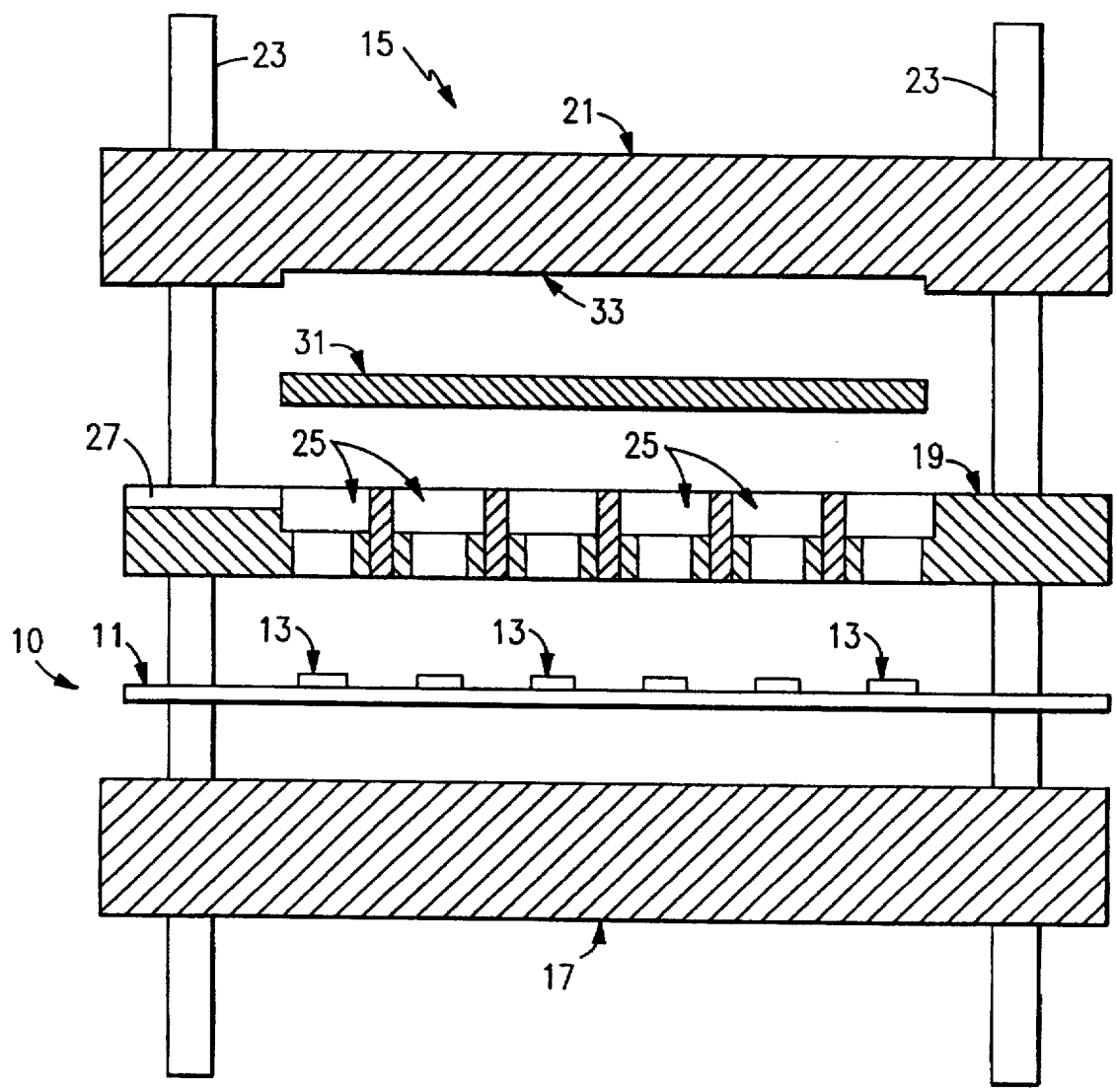
FIGS. 2 and 3 represent a mold apparatus in open and closed positions, respectively, this apparatus designed to manufacture an elastomeric support member in accordance with one aspect of the invention.

In FIG. 2, there is shown a mold apparatus 15 for use in producing an elastomeric support member (as described below) is accordance with one embodiment of the invention. Mold apparatus 15 includes a bottom plate 17, center (interim) plate 19 and a top plate 21. These three plates are located on a plurality (e.g., four) of support posts 23 (only two shown in FIG. 2) for relative movement thereon. Bottom plate 17 preferably remains stationery with the center and top plates 19 and 21 adapted for movement as needed. It is of course understood that the invention is not limited to the particular apparatus shown in FIGS. 2 and 3, in that others, including those known in the industry, could be used.

in accordance with the teachings herein, center plate 19 includes a plurality of stepped apertures 25 therein, each such stepped aperture defining the outer configuration for the desired elastomeric elements of the invention. At least one runner 27 is also included to provide a supply conduit to the apertures 25.

In FIG. 2, locating plate 10 is shown as also positioned within apparatus 15 such that each of the metallic pad members 13 aligns with a respective aperture 25. Layer 11 preferably includes openings 29 (FIG. 1) designed for having a respective support post 23 pass therethrough, thereby facilitating positioning and alignment of sheet 10.

In FIG. 2, a stiffener 31 is also preferably added to apparatus 15, this stiffener to eventually become part of the final product. In one example, stiffener 31 may comprise a stainless steel plate of substantially rectangular configuration, having length and width dimensions of about 1.00 inch and 0.50 inch, respectively. Additionally, stiffener 31 may include a thickness of about 0.01 inch. Stiffener 31 is positioned atop center plate 19 and aligned with a corresponding recess 33 within the top plate 21. This positioning relationship is better seen in FIG. 3.

Figure 3:
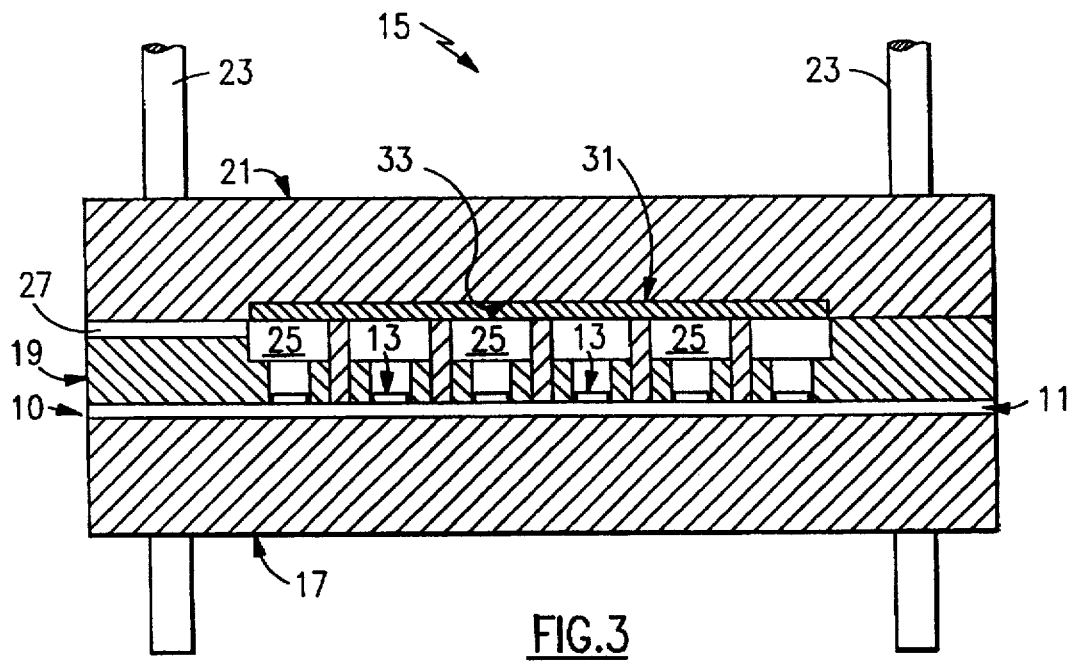

In FIG. 3, mold apparatus 15 is closed about locating sheet 10 and stiffener 31 such that suitable elastomer mold material (not shown) can now be transferred (through runner 27) to fill apertures 25 and produce an elastomeric support structure in accordance with the teachings of the invention. One example of a compound elastomer material suitable for use in the invention is Dow Corning Silastic LCS-745 elastomer (a silicone elastomer), mixed with one part per hundred of a suitable cross-linking agent for adding strength and stress relaxation properties in the final compound. One example of such a cross-linking agent is Varox DBPH-50. (Silastic is a trademark of Dow Corning and Varox is a trademark of R. T. Vanderbilt Company.) This compound is now added and molding occurs. In one example, a mold period of from about 5 to about 20 minutes is preferably used, at a temperature of about 150° Celsius (C) to about 200° C. In a particular example, the mold period is for about 10 minutes at a temperature of 175° C.

During molding, the elastomeric material supplied to apparatus 15 bonds to both the undersurface of stiffener 31, as well as, significantly, to each of the metallic pad members 13 of locating sheet 10. This bond, being formed from the described vulcanizing process, is thus completed between elastomer and metallic elements.

Following molding, curing of the elastomeric material is provided for a specified time period and temperature. In one example, this time period may range from two to about six hours at a temperature of from about 175° C. to 225° C. In a specific example, this cure will occur for four hours at about 205° C.

Following molding, mold apparatus 15 is opened, exposing the locating sheet 10. (It is understood that cuing of the elastomer occurs externally of the mold apparatus.) Significantly, the next step in the process defined herein involves removing (e.g., stripping) the layer 11 of base material from the pad member-elastomer elements. As stated, the aforementioned adhesive allows such removal to occur at this time. Use of an adhesive tape with backer as described above facilitates this adhesive removal. Specifically, it is only necessary to fold an edge of the tape to expose a surface to initiate tape peel (removal). Individual pad members 13 are thus molded or vulcanized to the respective elastomeric members (FIG. 4).

Figure 4:
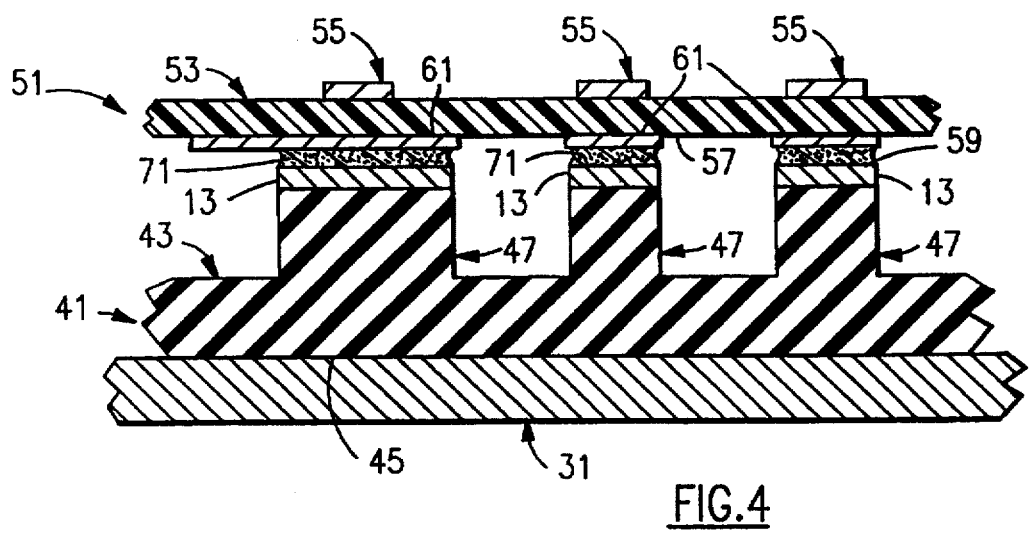
FIG. 4 is a partial, side elevational view, in section, of a circuitized substrate in accordance with one embodiment of the invention.

In FIG. 4, there is shown the elastomeric support member 41 as produced in accordance with the above-described process. Support member 41 includes a quantity of stepped elastomeric material 43 bonded, as shown, along a common surface 45 to stiffener 31. (The stiffener and elastomer are inverted in comparison to the orientation in FIG. 3.) The elastomer includes a plurality of upstanding portions 47, as a result of being formed using a mold of the configuration in FIG. 3. On each such upstanding portion 47 is securely attached a respective pad member 13. It is thus understood that elastomeric 43 and pad members 13 represent an elastomeric support member in accordance with the teachings herein. As-stated, this support member may include a stiffener 31 as part thereof.

To provide a circuitized substrate in accordance with one embodiment of the teachings herein, a flexible circuit 51 including at least one layer 53 of dielectric material (e.g., polyimide) having a plurality of electrically conductive members (e.g., copper pads and/or circuit lines 55) thereon is provided. Another suitable dielectric material for layer 53 is polytetrafluoroethylene, one example being Teflon. In one example, dielectric layer 53 may include a thickness of only about 0.001 inch while the respective conductive members (pads and/or circuit lines 55) may include a thickness of only about 0.0007 inch each.

Flexible circuit 51, as shown, is physically attached to support member 41. In one embodiment, this can be accomplished by using a suitable adhesive, Eastman 910 (Eastman is a trademark of Kodak Co.) or Rogers R1500 (Rogers is a trademark of the Rogers Corporation). Other suitable adhesives may be used. As shown is FIG. 4, this adhesive serves to bond the under surface 57 of dielectric 53 directly to the corresponding upper surfaces, e.g., 59 of pad members 13. Significantly, flexible circuit 51 is aligned such that at least some of the conductive members 55 each align with a respective one of the upstanding portions 47 of elastomer 43 (and associated pad member 13). This is considered significant to provide substantially independent force exertion on each conductive member 55, in addition to compensating for lack of planarity when mating flexible circuit 51 with a second circuitized substrate (e.g., printed circuit board).

In the embodiment of FIG. 4, it is preferred to add a plurality of metallic elements 61 to the undersurface 57 of dielectric 53 relative to the corresponding locations of metallic pad members 13. In this arrangement, it is possible to use the aforementioned adhesive to bond flexible circuit 51 to elastomer 41, but, more significantly, it is also possible to use alternative means for attaching these two structures. In a preferred example, such attachment means involves the use of solder, whereupon a paste or the like is utilized, the two members 41 and 51 being aligned and positioned in contact with each other (as shown in FIG. 4) with heat then being applied to effect solder reflow. The result is a strong solder bond 71 at the locations between the metallic elements as shown. In one example, an acceptable solder for this purpose would be a 60:40 Sn:Pb alloy, wherein the tin comprises about sixty percent by weight of the solder composition and the lead comprises substantially the remaining forty percent by weight.

Figure 5:
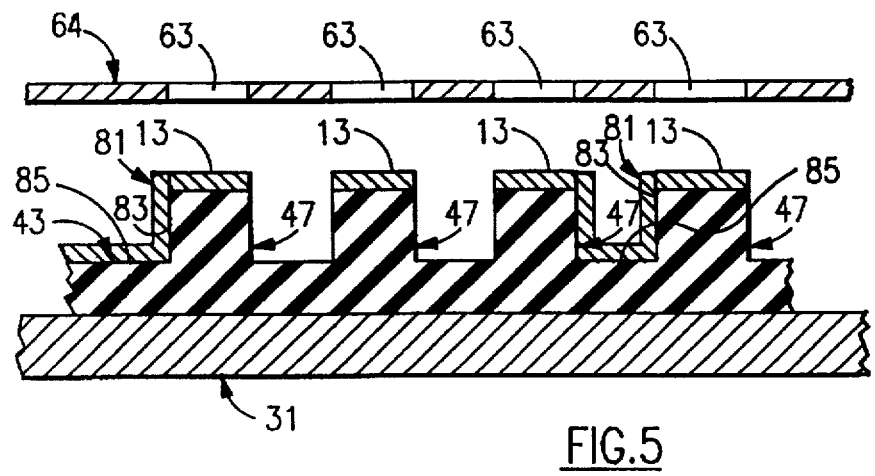
FIG. 5 illustrates an alternative method of making a circuitized substrate in accordance with one embodiment of the invention.

In FIG. 5, there is shown an alternative method of providing an elastomeric support member in accordance with the invention. In the embodiment of FIG. 5, the elastomer 43 and stiffener subassembly is formed in a mold apparatus such as described above, but, significantly, excludes metallic pad members thereon. That is, a locating sheet is not utilized in such a mold apparatus as occurred in the embodiments depicted in FIGS. 2 and 3. Thus, only a subassembly having the described stiffener 31 with formed, stepped elastomer 43 thereon, results from such a mold operation.

Application of metallic pad members to this formed subassembly (and specifically to the upstanding portions 47 of the elastomer) is preferably accomplished using sputtering. For example, the elastomer and stiffener may be positioned within an in-line vacuum chamber of a suitable sputtering apparatus (e.g., DC Magnetron), whereupon metal is applied to the exposed surfaces of the elastomer 43. Definition of these surfaces is preferably accomplished using a mask 64, as shown in FIG. 5. Mask 64 includes a corresponding number of openings 63 therein for alignment with the respective upstanding portions 47. Mask 64 is shown in a raised position in FIG. 5 and it is understood it is lowered for this alignment. It is noted that the mask need not be limited to independent members, but may also be of a family of coatings or photo-imagable materials capable of withstanding the sputtering process. Independent masks, as shown in FIG. 5, may be produced from metal, polyimide or the like materials.

In a preferred embodiment, the metallic pad numbers (13 in FIG. 5) are formed by at least two sputtering operations, such that at least two different metals are applied. In a preferred embodiment, approximately 250 angstroms of chromium are first applied to the exposed surfaces of upstanding portions 47, followed by sputtering of about 3,000 angstroms of copper. Prior to chromium deposition, the exposed surfaces of the elastomer are pretreated (e.g., using an oxygen RF plasma) which improves metal adhesion. The resulting support member (stiffener-elastomer-pad members) is now able to be secured to a respective flexible circuit member (as shown in FIG. 4). The resulting pad members are preferably of cylindrical configuration each having a diameter of only about 0.013 inch, and spaced apart from the nearest adjacent pad member a distance of only about 0.020 inch. It is understood that the sputtered metallic pad members 13 may be either directly secured (e.g., using adhesive) to the dielectric of the flexible circuit or, alternatively, secured (e.g., using solder) to metallic elements formed on the dielectrics under surface. Such bonding may be accomplished using the same materials as described above in the embodiment of FIG. 4.

The above thicknesses of metal materials is not meant to limit the invention, in that others could be readily applied. It is also understood that, in accordance with the broader teachings of the invention, the elastomeric support member as shown in FIG. 5 need not include the described stiffener as part thereof, but could instead represent a singular, integral unit adapted for having the respective pad members placed thereon. Even further, it is within the scope of the invention to also provide a metallic coating 81 to other portions of the elastomer, if desired (e.g., as alternative circuitry, e.g., to couple respective pad members). Such additional circuitry is shown in FIG. 5 of substantially similar thickness to that of pad members 13 and may lie along the vertical and/or horizontal surfaces 83 and 85 relative to selected ones of the upstanding portions 47.

It has been demonstrated that the defined thin layers of copper conform well to the elastomer, withstanding deflection and deformation without adversely affecting the adhesive bond between the flexible circuit member (51) and support member (41).

Thus, there has been shown and described a new and unique circuitized structure and method for making same wherein a stepped or the like elastomer is utilized and, significantly, which includes metallic pad members thereon (fixably secured thereto). This support member is capable of being readily secured, using, e.g., an adhesive or a more permanent, solder bond, to a flexible circuit to thereby provide a unique structure which, as understood, may be of extremely compact design with high density circuit pads and/or lines as part thereof. Of further significance, respective pads of the circuit are positioned relative to corresponding elastomeric upstanding portions to thus assure substantial independence of force exertion thereto, e.g., to assure uniform force application while assuring compensation for lack of planarity. As described herein, the method of making such a structure is relatively easy to perform and my be accomplished at relatively minor cost.

While there has been shown and described what are at present considered the preferred embodiments of the invention, it will be obvious to those skilled in the art that various changes and modifications may be made therein without departing from the scope of the invention as defined by the appended claims.

What is claimed is:

1. A circuitized structure comprising:
    a flexible circuit including at least one layer of dielectric material having a plurality of electrically conductive members on a first surface thereof;
    an elastomeric member including a plurality of upstanding portions;
    plurality of metallic pad members, selected ones of said pad members being secured to a respective one of said upstanding portions of said elastomeric member; and
    means for bonding each of said selected ones of said pad members to said flexible circuit at locations relative to respective ones of said electrically conductive members.

2. The circuitized structure of claim 1 wherein said layer of dielectric material is comprised of polyimide.

3. The circuitized structure of claim 1 wherein each of said electrically conductive members comprises a metal pad.

4. The circuitized structure of claim 3 wherein said metal pads are comprised of copper.

5. The circuitized structure of claim 1 wherein said elastomeric member is comprised of silicone rubber.

6. The circuitized structure of claim 1 wherein said metallic pad members are comprised of copper.

7. The circuitized structure of claim 1 wherein said flexible circuit further includes a plurality of metallic elements, each of selected ones of said metallic elements located on a second surface of said dielectric material substantially opposite a respective one of said electrically conductive members, said pad members secured to said elastomeric member being bonded to respective ones of said metallic elements.

8. The circuitized structure of claim 1 further includes a stiffener member secured to said elastomeric member for providing substantial rigidity to said elastomeric member.

9. The circuitized structure of claim 1 wherein said elastomeric member includes a plurality of first, second and third surfaces, said metallic pad members secured to said upstanding portions of said elastomeric member being secured to respective ones of said first surfaces.

10. The circuitized structure of claim 9 wherein selected ones of said second and third surfaces of said elastomeric member include a metallic coating thereon.

11. The circuitized structure of claim 10 wherein said metallic coating comprises electrical circuitry.

12. The circuitized structure of claim 11 wherein said electrical circuitry electrically couples at least two of said metallic pad members on said upstanding portions of said elastomeric member.

* * * * *